United States Patent
Mitsui et al.

(10) Patent No.: US 12,227,674 B2
(45) Date of Patent: Feb. 18, 2025

(54) POLISHING COMPOSITION COMPRISING POLISHING PARTICLES HAVING HIGH WATER AFFINITY

(71) Applicant: NISSAN CHEMICAL CORPORATION, Tokyo (JP)

(72) Inventors: Shigeru Mitsui, Funabashi (JP); Tohru Nishimura, Funabashi (JP); Eiichiro Ishimizu, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/869,013

(22) Filed: Jul. 20, 2022

(65) Prior Publication Data
US 2022/0356373 A1 Nov. 10, 2022

Related U.S. Application Data

(62) Division of application No. 16/765,586, filed as application No. PCT/JP2019/042889 on Oct. 31, 2019, now abandoned.

(30) Foreign Application Priority Data

Nov. 1, 2018 (JP) .................................. 2018-206414

(51) Int. Cl.
*C09G 1/02* (2006.01)
*H01L 21/306* (2006.01)

(52) U.S. Cl.
CPC .......... *C09G 1/02* (2013.01); *H01L 21/30625* (2013.01)

(58) Field of Classification Search
CPC ........ H01L 21/02024; H01L 21/30625; C09G 1/02
See application file for complete search history.

(56) References Cited

U.S. PATENT DOCUMENTS

| | | | |
|---|---|---|---|
| 2008/0171441 A1* | 7/2008 | Takemiya | H01L 21/7684 257/E21.244 |
| 2017/0178926 A1 | 6/2017 | Matsushita et al. | |
| 2017/0247574 A1* | 8/2017 | Takahashi | C09K 3/1436 |
| 2018/0057711 A1 | 3/2018 | Onishi et al. | |
| 2019/0080927 A1* | 3/2019 | Izawa | H01L 21/3212 |
| 2019/0185713 A1* | 6/2019 | Mosley | C09G 1/02 |
| 2019/0256742 A1 | 8/2019 | Suzuki et al. | |

FOREIGN PATENT DOCUMENTS

| | | |
|---|---|---|
| JP | 2002-338951 A | 11/2002 |
| JP | 2009-131947 A | 6/2009 |
| JP | 2017117894 * | 12/2015 |
| JP | 2017-117894 A | 6/2017 |
| JP | 2018-002883 A | 1/2018 |
| JP | 2018-104690 A | 7/2018 |
| WO | 2015/152151 A1 | 10/2015 |
| WO | 2018/012174 A1 | 1/2018 |
| WO | 2018/116890 A1 | 6/2018 |
| WO | 2018-124229 A1 | 7/2018 |

OTHER PUBLICATIONS

Written Opinion of the International Searching Authority dated Dec. 17, 2019 from International Patent Application No. PCT/JP2019/042889 (with English-language partial translation).

Jun. 20, 2022 Extended European Search Report issued in European Application 19879292.1.

* cited by examiner

*Primary Examiner* — Thomas T Pham
(74) *Attorney, Agent, or Firm* — Oliff PLC

(57) ABSTRACT

A polishing composition having silica-based abrasive grains and a polishing method. A polishing composition having silica particles, wherein on the basis of a colloidal silica dispersion of the silica particles, the dispersion has an Rsp of 0.15 to 0.7 as measured using pulse NMR, and the colloidal silica particles have a shape coefficient SF1 of 1.20 to 1.80, wherein Rsp is calculated based on equation (1):

$$Rsp=(Rav-Rb)/(Rb) \quad (1)$$

(wherein Rsp is an index that indicates water affinity; Rav is an inverse of a relaxation time of the colloidal silica dispersion; and Rb is an inverse of a relaxation time of a blank aqueous solution obtained by removing the silica particles from the colloidal silica dispersion), and the shape coefficient SF1 is calculated based on equation (2):

$$SF1=(\text{area of a circle whose diameter is a maximum diameter of the particle})/(\text{projected area}) \quad (2).$$

13 Claims, No Drawings

POLISHING COMPOSITION COMPRISING POLISHING PARTICLES HAVING HIGH WATER AFFINITY

CROSS REFERENCE TO RELATED APPLICATION

This application is a divisional application of U.S. Ser. No. 16/765,586, filed May 20, 2020, which application is a National Stage of PCT/JP2019/042889, filed Oct. 31, 2019, the contents of which are incorporated herein by reference.

TECHNICAL FIELD

The present invention relates to a polishing composition comprising silica-based abrasive grains and a polishing method.

BACKGROUND ART

Polishing compositions comprising silica-based abrasive grains have been used to polish silicon wafers.

As a multilayer interconnection has been recently formed on the surface of a semiconductor substrate, in the formation of a device, an integrated circuit is produced by embedding a silicon oxide film or a metal interconnection in a stepped substrate, planarizing it, and further applying lithography to the planarized surface to provide a multilayer interconnection. As a pattern has become more integrated, the pattern has become even more miniaturized. The chemical ray used for lithography is now a near-ultraviolet ray, a far-ultraviolet ray, or an extreme-ultraviolet ray. The resist exposure wavelength has also become shorter, i.e., 248 nm, 193 nm, 157 nm, or 13.6 nm. Even electron beam lithography is now being used. When lithography is applied many times to form a multilayer interconnection, if a short wavelength is used as the exposure wavelength used for lithography, the polishing surface must be planarized to a high level; otherwise, the exposure light produces a diffuse reflection at the interface between the resist and the substrate on that surface, and a rectangular resist pattern cannot be formed. As a result, the resist pattern cannot be transferred onto the underlayer.

Thus, it is essential to not only improve the polishing speed of the silicon oxide film, but also to reduce scratch formation or defects on the polishing surface.

These polishing compositions each contain silica-based abrasive grains, an alkali component, a water-soluble compound, a chelating agent, an oxidizing agent, a metal corrosion inhibitor, and the like in an aqueous medium.

A polishing composition is disclosed in which silica particles used as abrasive grains are defined using a function that indicates the affinity with water, which is determined from the relationship between the inverse of a relaxation time in pulse NMR and the total surface area of the silica particles (see Patent Document 1).

A polishing composition is disclosed which is defined in terms of the relationship between the BET specific surface area and the specific surface area measured by the pulse NMR method of silica particles contained in abrasive grains (see Patent Document 2).

Polishing compositions are disclosed for which the solvent affinity of abrasive grains is evaluated using an NMR relaxation time (see Patent Documents 3 and 4).

PRIOR ART DOCUMENTS

Patent Documents

Patent Document 1: WO 2018/116890
Patent Document 2: WO 2015/152151
Patent Document 3: Japanese Unexamined Patent Application Publication No. 2017-117894 (JP 2017-117894 A)
Patent Document 4: WO 2018/012174

SUMMARY OF THE INVENTION

Problem to be Solved by the Invention

In the present invention, attention was given to the affinity with an aqueous medium of silica particles used as abrasive grains, in the aqueous medium of a polishing composition, and the value of a parameter used as an index of the affinity was defined. Then, it was found that a combination of an optimal value of the affinity with a shape of the silica particles can improve the polishing speed, and achieve a good polishing surface. Accordingly, it is an object of the present invention to achieve a high polishing speed when the polishing composition is used for CMP polishing of a device wafer, and reduce the formation of defects.

Means for Solving the Problems

A first aspect of the present invention is a polishing composition comprising silica particles, wherein on the basis of a colloidal silica dispersion of the silica particles, the dispersion has an Rsp of 0.15 to 0.7 as measured using pulse NMR, and the colloidal silica particles have a shape coefficient SF1 of 1.20 to 1.80, wherein Rsp is calculated based on equation (1):

$$Rsp=(Rav-Rb)/(Rb) \qquad (1)$$

(wherein Rsp is an index that indicates water affinity; Rav is an inverse of a relaxation time of the colloidal silica dispersion; and Rb is an inverse of a relaxation time of a blank aqueous solution obtained by removing the silica particles from the colloidal silica dispersion), and the shape coefficient SF1 is calculated based on equation (2):

$$SF1=(\text{area of a circle whose diameter is a maximum diameter of the particle})/(\text{projected area}) \qquad (2);$$

a second aspect of the present invention is the polishing composition according to the first aspect, wherein the colloidal silica dispersion has an average particle diameter of 40 to 200 nm as measured by a dynamic light scattering method, and the silica particles in the dispersion have an average primary particle diameter of 10 to 80 nm as measured by a nitrogen gas adsorption method;

a third aspect of the present invention is the polishing composition according to the first or second aspect, wherein the colloidal silica dispersion is obtained by being subjected to a thermal history at a temperature of 110° C. or higher and lower than 150° C., in particle growth of activated silicate under alkaline conditions in the presence of potassium ions;

a fourth aspect of the present invention is the polishing composition according to any one of the first to third aspects, further comprising at least one additive selected from the group consisting of an acid component, an alkali component, a water-soluble compound, a chelating agent, an oxidizing agent, and a metal corrosion inhibitor;

a fifth aspect of the present invention is the polishing composition according to the fourth aspect, wherein the alkali component is potassium hydroxide or potassium hydrogen carbonate, or a mixture of potassium hydroxide or potassium hydrogen carbonate with sodium hydroxide, ammonia, primary ammonium hydroxide, secondary ammonium hydroxide, tertiary ammonium hydroxide, quaternary ammonium hydroxide, primary ammonium carbonate, secondary ammonium carbonate, tertiary ammonium carbonate, quaternary ammonium carbonate, primary ammonium hydrogen carbonate, secondary ammonium hydrogen carbonate, tertiary ammonium hydrogen carbonate, quaternary ammonium hydrogen carbonate, lithium carbonate, sodium carbonate, potassium carbonate, lithium hydrogen carbonate, or sodium hydrogen carbonate;

a sixth aspect of the present invention is the polishing composition according to the fourth aspect, wherein the chelating agent is an aminocarboxylic acid-based chelating agent or a phosphonic acid-based chelating agent;

a seventh aspect of the present invention is the polishing composition according to any one of the first to sixth aspects, wherein the polishing composition has a pH of 1 to 12; and an eighth aspect of the present invention is the polishing composition according to any one of the first to seventh aspects, wherein the polishing composition is used to polish a silicon wafer or a device wafer.

Effects of the Invention

In the present invention, attention was given to the affinity with an aqueous medium (water affinity) of silica particles used as abrasive grains, in the aqueous medium of a polishing composition, and the value of a parameter used as an index of the affinity was defined. Then, it could be found that a combination of an optimal value of the affinity with a shape of the silica particles can improve the polishing speed, and reduce defects formed on the polishing surface. Defect formation is caused by scratch formation or adhesion of foreign matter on a stepped substrate. While the cause of scratch formation has not been elucidated, some scratches are considered to result from the abrasive grains, and others from the object to be polished, and these scratches can exist together.

When lithography is applied to an upper layer after planarization of the polishing surface, the formation of defects (minute foreign matter having a size of several tens of nanometers or more that remains on the substrate after polishing) may cause the resist exposure light to produce a diffuse reflection, or cause a defocus failure, which prevents the formation of a rectangular pattern. Moreover, when a substrate is processed, such defects may form a mask to produce etching resistance, which causes a substrate processing failure, resulting in a defect in the production of a semiconductor element. It is therefore necessary to reduce defects.

Improvement in polishing speed and planarization of the polishing surface have been effects that trade off with each other, and difficult to achieve both; however, both these effects that trade off with each other can be achieved by providing the silica particles with water affinity in a specific range and a shape in a specific range.

A polishing composition contains silica particles as polishing abrasive grains. The silica particles have effect on the polishing speed and the planarization property for the polishing surface, through an interaction with an aqueous medium in the polishing composition, depending on the surface condition.

The state of water involved in the surface of the silica particles used as polishing abrasive grains in the polishing composition is divided into bound water and free water. Free water refers to the water that is present around the silica particles, but is not bound therewith and present in a free state, and not the water as a solvent. Bound water refers to the water bound with the silica particles by hydrogen bonding with silanol groups on the silica particle surface. Bound water plays an important role in ensuring good contact of the silica particles with water.

The state of the water can be grasped by measuring the relaxation time of the protons of water molecules.

Relaxation involves the process in which absorbed energy is emitted; and the process in which the phases of precession of nuclear spins are disordered from the aligned state. The former is denoted as spin-lattice relaxation (longitudinal relaxation), and the relaxation time is denoted as T1; and the latter is denoted as spin-spin relaxation (transverse relaxation), and the relaxation time is denoted as T2. In T1 relaxation, relaxation is most likely to occur when the speed of molecular motion is approximately the same as the resonant frequency. The response time to a change in magnetic field, that is, the relaxation time, differs between free water molecules not in contact with the silica particles and water molecules in contact with the silica particles. A shorter relaxation time is considered to indicate greater particle surface in contact with water, and higher dispersibility of the particles.

In T2 relaxation, relaxation occurs through a magnetic interaction. The measurement of relaxation time using pulse NMR can be regarded as the measurement method that utilizes the difference in T2 relaxation.

During polishing, the presence of the bound water in a specific range of amounts functions effectively to improve the polishing speed, and reduce scratches and defects on the polishing surface. Moreover, the shape of the silica particles also has effect on the presence of the bound water in a specific range of amounts, and the shape factor (shape coefficient SF1) needs to fall in a specific range of values.

The shape factor (shape coefficient SF1) of the silica particles is also greatly related to the polishing speed. When the shape of the silica particles changes from a spherical to a different shape, the number of contacts with the surface to be polished is considered to increase, which improves the polishing speed. In contrast, the possibility of scratch formation also increases. Thus, the shape factor (shape coefficient SF1) also preferably falls in a specific range.

In the present invention, by controlling the shape factor (shape coefficient SF1) and the affinity with an aqueous medium of the silica particles used as polishing abrasive grains to a high level, it is possible to achieve an improvement in polishing speed and a scratch reduction (defect reduction), particularly in CMP polishing.

MODES FOR CARRYING OUT THE INVENTION

The present invention is a polishing composition comprising silica particles, wherein on the basis of a colloidal silica dispersion of the silica particles, the dispersion has a measurement value of pulse NMR, namely, $Rsp=(Rav-Rb)/(Rb)$, of 0.15 to 0.7, 0.35 to 0.7, or 0.35 to 0.65, and the silica particles have a shape coefficient, namely, SF1=(area of a circle whose diameter is a maximum diameter of the particle)/(projected area), of 1.20 to 1.80, 1.23 to 1.80, or 1.24 to 1.60, wherein Rsp is an index that indicates water affinity; Rav is an inverse of a relaxation time of the colloidal silica dispersion; and Rb is an inverse of a relaxation time of a blank aqueous solution obtained by removing the silica particles from the colloidal silica dispersion.

The colloidal silica dispersion has an average particle diameter of 40 to 200 nm or 30 to 150 nm as measured by a dynamic light scattering method, and the silica particles in the dispersion have an average primary particle diameter of 10 to 80 nm or 20 to 70 nm as measured by a nitrogen gas adsorption method.

The measurement principle of the technique used herein (pulse NMR) is based on the fact that solvent molecules that are in contact with or adsorbed on the particle surface and solvent molecules in the solvent bulk (solvent molecules in a free state that are not in contact with the particle surface) respond differently to a change in magnetic field. In general, the motion of liquid molecules adsorbed on the particle surface is restricted, while liquid molecules in the bulk liquid can move freely. As a result, the NMR relaxation time of the liquid molecules adsorbed on the particle surface is shorter than the relaxation time of the molecules in the bulk liquid.

The relaxation time measured in the dispersion of the particles is the average value of two relaxation times that reflect the volume concentration of the liquid on the particle surface and the volume concentration of the liquid in a free state (liquid that is in the bulk liquid, but is not adsorbed on the particle surface).

It is noted here that a relaxation time constant R is the inverse of a relaxation time T, and is determined based on the equation:

$$Rav = PsRs + PbRb$$

Rav: average relaxation time constant, that is, the inverse of the relaxation time of the colloidal silica dispersion;

Ps: volume concentration of the liquid on the particle surface, that is, the volume concentration of the colloidal silica dispersion;

Rs: relaxation time constant of adsorbed-phase liquid molecules onto the particle surface, that is, the inverse of the relaxation time of the colloidal silica dispersion;

Pb: volume concentration of the bulk liquid, that is, the volume concentration of a blank aqueous solution obtained by removing the silica particles from the colloidal silica dispersion; and Rb: relaxation time constant of bulk liquid molecules, that is, the inverse of the relaxation time of the blank aqueous solution obtained by removing the silica particles from the colloidal silica dispersion.

The measurement value of pulse NMR of the dispersion can be determined based on the equation: $Rsp=(Rav-Rb)/(Rb)$.

Rav and Rb are each the inverse of a relaxation time (transverse relaxation time T2; specifically, an NMR relaxation time obtained after the silica abrasive grains are dispersed and an NMR relaxation time obtained before the silica abrasive grains are dispersed (only the dispersion medium)) measured using a pulse NMR system, Acorn area, manufactured by Xigo nanotools Inc. (USA). The measurement conditions may be as follows: magnetic field: 0.3 T, measurement frequency: 13 MHz, measurement nucleus: $^1H$ NMR, measurement method: CPMG pulse sequence method, sample volume: 0.4 mL, temperature: 30° C.

Rsp serves as an index of the water affinity of the particle surface. When the specific surface area is the same, a higher value (Rsp) indicates higher water affinity.

The shape coefficient SF1 can be determined based on the equation: (area of a circle whose diameter is a maximum diameter of the particle)/(projected area).

That is, $SF1=(D_L^2 \times \pi/4)/S$ $D_L$ is the maximum diameter nm of the particle, the maximum length (nm) of the silica particle determined based on a transmission electron micrograph, and is the greatest length between given two points on the circumference in the micrograph; and S is the projected area ($nm^2$) of the silica particle.

$D_L$ is the maximum length of the silica particle determined based on image analysis of a transmission electron micrograph (TEM), and S is the projected area of the silica particle determined based on image analysis of the transmission electron micrograph. Specifically, a transmission electron micrograph taken at a magnification of 10,000 or 30,000 times is captured as electronic data into an image analysis apparatus (trade name LUZEX manufactured by Nireco Corporation) at a resolution of 146 dpi, and the projected area is determined by converting the number of pixels occupied by the silica particle to area. For example, in a micrograph with a magnification of 10,000 times, the length of one side of a pixel is 17.8 nm; therefore, the area per pixel can be converted as 319 $nm^2$. In a micrograph with a magnification of 30,000 times, the length of one side of a pixel is 6.0 nm; therefore, the area per pixel can be converted as 36 $nm^2$.

SF1 is determined by determining the maximum length $D_L$ and the projected area S for each of 300 particles recognized by the image analysis apparatus, calculating, for each particle, a calculation value based on the equation shown above, and obtaining an average value of the calculation values.

The method for producing the colloidal silica dispersion (silica sol) to be used in the present invention can be broadly divided into a step (I) of obtaining activated silicate; a step (II) of heating and regulating the size of the activated silicate; and a step (III) of adjusting the concentration of the resulting silica sol.

The step (I) of obtaining activated silicate is divided into a step (a) of obtaining activated silicate; a step (a1) of increasing the purity of the activated silicate; and a step (a2) of collecting the activated silicate with an increased purity. The step (a) is essential, and the steps (a1) and (a2) are optional.

For example, the step (a) is the step of contacting a hydrogen-type strongly acidic cation exchange resin with an aqueous solution of an alkali metal silicate in which an aqueous alkali metal silicate containing 300 to 10,000 ppm of a metal oxide other than silica, based on the silica content, is dissolved at a concentration of 1 to 6% by weight, as the $SiO_2$ content derived from the silicate, to thereby produce an aqueous solution of activated silicate having a $SiO_2$ concentration of 1 to 6% by mass, and collecting the resulting solution.

The step (II) of heating and regulating the size of the activated silicate includes the following steps (b) and (c):

step (b): adding an aqueous solution of potassium hydroxide to the aqueous solution of the activated silicate collected in the step (a) to produce a stabilized aqueous solution of the activated silicate having a $SiO_2$ concentration of 1 to 6% by mass, and having a pH of 7 to 9; and step (c): supplying, with sufficient stirring, an aqueous solution of an alkali metal silicate obtained by adding an aqueous solution of potassium hydroxide to the aqueous solution of the activated silicate collected in the step (b) or an aqueous solution of an alkali metal silicate having a pH of 10 to 12.5 and a $SiO_2$ concentration of 0.1 to 8% by weight obtained by concentrating or diluting the aqueous solution obtained above, and an aqueous solution of activated silicate obtained as in the step (b), while maintaining the temperature of the resulting mixture at 110° C. to lower than 150° C., 110 to 145° C., 110 to 140° C., 110 to 135° C., or 110 to 130° C., in a period of 1 to 30 hours, until the pH of the mixture reaches 9 to 12.

The step (III) of adjusting the concentration of the resulting silica sol is the step of concentrating the silica sol to a concentration of 10 to 50% by mass, wherein impurities may be removed from the silica sol before or after being concentrated. The step (III) is not essential, but may be performed as required.

For example, the step (III) includes:
a step (d): contacting the stable aqueous silica sol obtained in the step (c) with a hydrogen-type strongly acidic cation exchange resin, and then contacting an aqueous silica sol produced by this contact with a hydroxyl group-type strongly basic anion exchange resin to thereby produce an acidic aqueous silica sol substantially free of a polyvalent metal oxide other than silica; and
a step (e): adding ammonia or potassium hydroxide to the acidic aqueous sol produced in the step (d) such that the pH of the sol becomes 8 to 11 to thereby produce a stable aqueous silica sol having a $SiO_2$ concentration of 10 to 50% by mass or 30 to 50% by mass, substantially free of a polyvalent metal oxide other than silica, and having an average particle diameter of the colloidal silica of 10 to 30 nm.

In the step (a), it is preferred to use sodium water glass having a $SiO_2/Na_2O$ molar ratio of about 2 to 4, which is available as an inexpensive industrial product. Polyvalent metals typically contained at relatively high concentrations as impurities include aluminum, iron, calcium, and magnesium. The aqueous solution of the alkali metal silicate is contacted with the hydrogen-type strongly acidic cation exchange resin. This contact may be preferably performed by passing the aqueous solution of the alkali metal silicate through a column packed with the ion exchange resin, and the solution that has passed through the column is collected as an aqueous solution of activated silicate having a $SiO_2$ concentration of 1 to 6% by mass, preferably 2 to 6% by mass. The hydrogen-type cation exchange resin may be used in an amount sufficient to exchange the total amount of alkali metal ions in the aqueous solution of the alkali metal silicate with hydrogen ions. The aqueous solution of the alkali metal silicate is preferably passed through the column at a space velocity of about 1 to 10 per hour.

Examples of the strong acid used in the step (a1) include inorganic acids, such as hydrochloric acid, nitric acid, and sulfuric acid. Nitric acid is the most preferred to improve the removal ratio of the aluminum content and the iron content.

In the step (a2), initially, the aqueous solution obtained in the step (a1) is contacted with the hydrogen-type strongly acidic cation exchange resin. This contact may be preferably performed by passing the aqueous solution through a column packed with the hydrogen-type strongly acidic cation exchange resin at a space velocity of 2 to 20 per hour, at 0 to 60° C., preferably 5 to 50° C. Subsequently, the aqueous solution obtained by passage through the column is contacted, preferably immediately after being obtained, with the hydroxyl group-type strongly basic anion exchange resin, at 0 to 60° C., preferably 5 to 50° C.

The aqueous solution of potassium hydroxide used in the step (b) is obtained by dissolving potassium hydroxide as a commercially available industrial product preferably having a purity of 95% or more in ion exchange water or industrial water from which cations have been removed, to give a concentration of preferably 2 to 20% by mass.

As the apparatus used in the step (c), a usual container that is acid-resistant, alkali-resistant, and pressure-resistant, equipped with a stirrer, a temperature controller, a liquid level sensor, a pressure-reducing device, a liquid supply device, the cooling device, and the like, may be used.

In the step (c), the liquid temperature inside the container is maintained at 110° C. to lower than 150° C.

The contact between the stable aqueous sol and the ion exchange resin in the step (d) may be performed as in the contact in the step (a).

Ammonia or potassium hydroxide used in the step (e) may be a commercially available industrial product, which preferably has a high purity. In the case of ammonia, it is preferably used as aqueous ammonia having a concentration of about 5 to 28% by mass. Instead of ammonia, quaternary ammonium hydroxide, guanidine hydroxide, a water-soluble amine, or the like may be used. In the present invention, potassium hydroxide can be suitably used.

In the present invention, the polishing composition may further comprise, in addition to the silica particles as abrasive grains and the aqueous medium, at least one additive selected from the group consisting of an alkali component, a water-soluble compound, a chelating agent, an oxidizing agent, and a metal corrosion inhibitor.

The solids content excluding the aqueous medium from the polishing composition is 0.01 to 20% by mass or 0.1 to 10% by mass, and the content of the silica particles in the solids content is 90 to 100% by mass or 90 to 99.9% by mass.

Examples of the alkali component include potassium hydroxide or potassium hydrogen carbonate, or a mixture of potassium hydroxide or potassium hydrogen carbonate with sodium hydroxide, ammonia, primary ammonium hydroxide, secondary ammonium hydroxide, tertiary ammonium hydroxide, quaternary ammonium hydroxide, lithium carbonate, sodium carbonate, potassium carbonate, lithium hydrogen carbonate, or sodium hydrogen carbonate.

It is preferred to use potassium hydroxide or potassium hydrogen carbonate. An alkali component other than those mentioned above may be used in combination at a mass ratio in the range of 10% or less, relative to potassium hydroxide or potassium hydrogen carbonate.

By adding these alkali components, the pH can be adjusted in the range of 7 to 12 or 8 to 11.

Any water-soluble compound may be used as the water-soluble compound. Examples of the water-soluble compound include monomers having carboxylic acid groups, such as acrylic acid, methacrylic acid, and maleic acid, polymers thereof, such as polyacrylic acid and polymethacrylic acid, and salts thereof, such as ammonium polyacrylate, potassium polyacrylate, ammonium polymethacrylate, and potassium polymethacrylate. Moreover, alginic acid, pectic acid, carboxymethyl cellulose, polyaspartic acid, polyglutamic acid, polyamide acid, polyamide acid ammonium salt, polyvinyl pyrrolidone, hydroxyethyl cellulose, glycerin, polyglycerin, polyvinyl alcohol, or carboxyl group- or sulfonic acid group-modified polyvinyl alcohol can be used.

The content of the water-soluble compound may be 0.01 to 10% by mass based on the silica particles.

As the chelating agent, an aminocarboxylic acid-based chelating agent or a phosphonic acid-based chelating agent may be used. The content of the chelating resin may be 0.01 to 10% by mass based on the silica particles.

Examples of the oxidizing agent include hydrogen peroxide, nitric acid, potassium periodate, hypochlorous acid, and ozone water. The content of the oxidizing agent may be 0.01 to 10% by mass based on the silica particles.

Examples of the metal corrosion inhibitor include triazole compounds, pyridine compounds, pyrazole compounds, pyrimidine compounds, imidazole compounds, guanidine compounds, thiazole compounds, tetrazole compounds, triazine compounds, and hexamethylenetetramine.

Examples of triazole compounds include 1,2,3-triazole, 1,2,4-triazole, 3-amino-1H-1,2,4-triazole, benzotriazole (BTA), 1-hydroxybenzotriazole, 1-hydroxypropylbenzotriazole, 2,3-dicarboxypropylbenzotriazole, 4-hydroxybenzotriazole, 4-carboxy-1H-benzotriazole, 4-carboxy-1H-benzotriazole methyl ester (methyl 1H-benzotriazole-4-carboxylate), 4-carboxy-1H-benzotriazole butyl ester (butyl 1H-benzotriazole-4-carboxylate), 4-carboxy-1H-benzotriazole octyl ester (octyl 1H-benzotriazole-4-carboxylate), 5-hexylbenzotriazole, (1,2,3-benzotriazolyl-1-methyl) (1,2,4-triazolyl-1-methyl) (2-ethylhexyl)amine, tolyltriazole, naphthotriazole, bis[(1-benzotriazolyl)methyl]phosphonic acid, 3H-1,2,3-triazolo[4,5-b]pyridin-3-ol, 1H-1,2,3-triazolo[4,5-b]pyridine, 1-acetyl-1H-1,2,3-triazolo[4,5-b]pyridine, 3-hydroxypyridine, 1,2,4-triazolo[1,5-a]pyrimidine, 1,3,4,6,7,8-hexahydro-2H-pyrimido[1,2-a]pyrimidine, 2-methyl-5,7-diphenyl-[1,2,4]triazolo[1,5-a]pyrimidine, 2-methylsulfanyl-5,7-diphenyl-[1,2,4]triazolo[1,5-a]pyrimidine, and 2-methylsulfanyl-5,7-diphenyl-4,7-dihydro-[1,2,4]triazolo[1,5-a]pyrimidine.

Examples of pyridine compounds include pyridine, 8-hydroxyquinoline, protionamide, 2-nitropyridin-3-ol, pyridoxamine, nicotinamide, iproniazid, isonicotinic acid, benzo[f]quinoline, 2,5-pyridinedicarboxylic acid, 4-styrylpyridine, anabasine, 4-nitropyridine-1-oxide, ethyl 3-pyridylacetate, quinoline, 2-ethylpyridine, quinolinic acid, arecoline, citrazinic acid, pyridine-3-methanol, 2-methyl-5-ethylpyridine, 2-fluoropyridine, pentafluoropyridine, 6-methylpyridin-3-ol, and ethyl 2-pyridylacetate.

Examples of pyrazole compounds include pyrazole, 1-allyl-3,5-dimethylpyrazole, 3,5-di(2-pyridyl)pyrazole, 3,5-diisopropylpyrazole, 3,5-dimethyl-1-hydroxymethylpyrazole, 3,5-dimethyl-1-phenylpyrazole, 3,5-dimethylpyrazole, 3-amino-5-hydroxypyrazole, 4-methylpyrazole, N-methylpyrazole, and 3-aminopyrazole.

Examples of pyrimidine compounds include pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetamidopyrimidine, 2-aminopyrimidine, and 4-aminopyrazolo[3,4-d]pyrimidine.

Examples of imidazole compounds include imidazole, 1,1'-carbonylbis-1H-imidazole, 1,1'-oxalyldiimidazole, 1,2,4,5-tetramethylimidazole, 1,2-dimethyl-5-nitroimidazole, 1,2-dimethylimidazole, 1-(3-aminopropyl)imidazole, 1-butylimidazole, 1-ethylimidazole, 1-methylimidazole, and benzimidazole.

Examples of guanidine compounds include guanidine, 1,1,3,3-tetramethylguanidine, 1,2,3-triphenylguanidine, 1,3-di-o-tolylguanidine, and 1,3-diphenylguanidine.

Examples of thiazole compounds include thiazole, 2-mercaptobenzothiazole, and 2,4-dimethylthiazole.

Examples of tetrazole compounds include tetrazole, 5-methyltetrazole, 5-amino-1H-tetrazole, and 1-(2-dimethylaminoethyl)-5-mercaptotetrazole.

Examples of triazine compounds include triazine and 3,4-dihydro-3-hydroxy-4-oxo-1,2,4-triazine.

The metal corrosion inhibitor may be added to give a content of 0.0001 to 10% by mass based on the silica particles.

The polishing composition of the present invention can be used to polish a semiconductor wafer or a semiconductor device.

CMP (Chemical Mechanical Polishing) is used to polish the semiconductor device. CMP can be adopted to form an interconnection on a semiconductor substrate. Examples of the object to be polished include a conductive material layer (interconnection layer), a barrier layer (layer composed of a barrier metal, for example, titanium nitride, tantalum nitride, or the like for preventing copper from diffusing into an insulating layer), and an insulating layer (layer composed of an interlayer insulating material, for example, a low-k material, such as $SiO_2$, SiOC, or porous silica).

More specifically, examples of the material constituting the conductive material layer include copper-based metals, such as copper, copper alloys, copper oxides, and copper alloy oxides; tungsten-based metals, such as tungsten, tungsten nitride, and tungsten alloys; cobalt-based metals, such as cobalt, cobalt alloys, cobalt oxides, and cobalt alloy oxides; silver, and gold. Among the above, at least one copper-based metal selected from the group consisting of copper, copper alloys, copper oxides, and copper alloy oxides is preferred, and copper is more preferred. The conductive material can be formed using a known method such as a sputtering method, a plating method, or the like.

The barrier metal constituting the barrier layer is formed to prevent the conductive material from diffusing into the insulating material, and improve the adhesion between the insulating material and the conductive material. The barrier metal material constituting the barrier metal is preferably at least one selected from the group consisting of tantalum-based metals, titanium-based metals, tungsten-based metals, ruthenium-based metals, cobalt-based metals, and manganese-based metals. Specifically, examples include tantalum-based metals, such as tantalum, tantalum nitride, and tantalum alloys; titanium-based metals, such as titanium, titanium nitride, and titanium alloys; tungsten-based metals, such as tungsten and tungsten alloys; ruthenium-based metals, such as ruthenium and ruthenium alloys; cobalt-based metals, such as cobalt and cobalt alloys; and manganese-based metals, such as manganese and manganese alloys.

Examples of the material constituting the insulating material include silicon-based materials and organic polymers. The insulating material may be in the form of a film (an insulating film; for example, an interlayer insulating film). Examples of the insulating film include a silicon-based coating and an organic polymer film. The insulating film can be formed using a CVD method, a spin coating method, a dip coating method, a spraying method, or the like.

Examples of the silicon-based materials include silica-based materials and low-k materials (low dielectric constant materials). Examples of the silica-based materials include silicon dioxide; fluorosilicate glass; organosilicate glass obtained using trimethylsilane or dimethoxydimethylsilane as a starting material; porous organosilicate glass; silicon oxynitride; and hydrogenated silsesquioxane.

Examples of the low-k materials include silicon carbide and silicon nitride.

A polishing method according to the present invention is performed, for example, as follows: A conductive thin film composed of a conductive material is formed on a silicon substrate. A resist film is formed on the conductive film, and the resist layer is exposed and developed with a circuit pattern as a mask by means of lithography to transfer the pattern onto the resist layer. With the transferred pattern as a mask, the conductive film is dry etched with a highly anisotropic ionic gas. Examples of the gas that can be used include tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane.

Then, the resist film is washed with oxygen gas to remove the resist layer. Alternatively, the resist layer may be removed with a chemical (for example, a mixture of sulfuric acid and hydrogen peroxide or a mixture of ammonia and hydrogen peroxide) to protect the substrate.

Subsequently, an insulating film is formed to prevent a short circuit with an upper-layer interconnection. The pattern of an underlayer interconnection is reflected on the wafer surface on which the interlayer insulating film is formed, and irregularities of various sizes are formed on the insulating film. When an interconnection is processed by further coating the upper layer with a resist film by means of lithography, the presence of these irregularities causes a diffuse reflection at the interface between the resist and the insulating film during resist exposure, which prevents the formation of a rectangular resist pattern, which makes the processing of the surface of the underlayer difficult. Thus, the wafer surface is planarized. The interlayer insulating film is planarized by CMP.

Moreover, although aluminum has been heretofore used as the interconnection material, it has a low melting point and has problems with reliability, such as a disconnection when a large current flows. Thus, aluminum interconnections are being replaced with copper interconnections. However, there is a problem in that copper may diffuse into an insulating layer. In a damascene process, therefore, trenches called "damascene" are formed, and then copper is embedded in the trenches. To prevent diffusion of copper into the insulating layer, a barrier layer may be formed between copper and the insulating film. Because of irregularities of copper produced by embedding copper to form a copper interconnection layer, the planarization of the surface of the copper interconnection layer is required to further apply lithography to an upper layer. In the planarization of copper, dry etching with a gas is difficult because of the hardness of copper, and therefore, polishing by CMP is performed here again.

EXAMPLES (Production of Activated Silicate)
Step (a)

JIS No. 3 sodium water glass was prepared as a raw-material aqueous alkali metal silicate. The water glass contained 28.8% by weight of $SiO_2$ and 9.47% by mass of $Na_2O$ as main components other than water. 478 g of the water glass was dissolved in 2,992 g of pure water to prepare 3,500 g of an aqueous solution of sodium silicate (a). Subsequently, the aqueous solution of sodium silicate (a) was passed through a column packed with a hydrogen-type strongly acidic cation exchange resin, Amberlite IR-120B, at a space velocity of 4.5 per hour, and then 3,000 g of the resulting aqueous solution of activated silicate was collected in a container.

Synthesis Example 1

A SUS pressure-resistant container having an internal volume of 3 L, equipped with a stirrer, a heating device, and the like, was used as a reactor. The aqueous solution of the activated silicate ($SiO_2$ content: 3.2% by mass), a 10% by mass aqueous solution of potassium hydroxide, and pure water were used, and the mixture was adjusted to pH=11.1; thereafter, the liquid temperature inside the container was controlled to 110 to 130° C. by heating. After the temperature inside the container reached 100 to 130° C., while the temperature inside the container was being maintained at 110 to 130° C., the aqueous solution of the activated silicate was further continuously supplied as a supply solution, until the pH of the reaction solution reached 11.2.

Heating was subsequently continued for 2 hours, while the resulting reaction solution was being maintained at 110 to 130° C., to obtain a silica sol.

The resulting silica sol was concentrated to give a $SiO_2$ concentration of 40% by mass at room temperature, using a commercially available ultrafiltration apparatus equipped with a tubular polysulfone ultrafiltration membrane with a pore diameter of about 5 nm. During concentration, the solution was stable, and concentration was extremely smoothly performed.

Synthesis Example 2

A SUS pressure-resistant container having an internal volume of 3 L, equipped with a stirrer, a heating device, and the like, was used as a reactor. The aqueous solution of the activated silicate ($SiO_2$ content: 3.2% by mass), a 10% by mass aqueous solution of potassium hydroxide, and pure water were used, and the mixture was adjusted to pH=11.2; thereafter, the liquid temperature inside the container was controlled to 110 to 130° C. by heating. After the temperature inside the container reached 120 to 140° C., while the temperature inside the container was being maintained at 120 to 140° C., the aqueous solution of the activated silicate was continuously supplied as a supply solution, until the pH of the reaction solution reached 11.3. After the supply of the aqueous solution of the activated silicate, the reaction was performed for 1 hour, while the temperature inside the container was being maintained at 120 to 140° C., and the aqueous solution of the activated silicate was further continuously supplied as a supply solution, until the pH of the reaction solution reached 10.9.

Heating was subsequently continued for 2 hours, while the resulting reaction solution was being maintained at 120 to 140° C., to obtain a silica sol.

The resulting silica sol was concentrated to give a $SiO_2$ concentration of 40% by mass at room temperature, using a commercially available ultrafiltration apparatus equipped with a tubular polysulfone ultrafiltration membrane with a pore diameter of about 5 nm. During concentration, the solution was stable, and concentration was extremely smoothly performed.

Synthesis Example 3

A SUS pressure-resistant container having an internal volume of 3 L, equipped with a stirrer, a heating device, and the like, was used as a reactor. The aqueous solution of the activated silicate ($SiO_2$ content: 3.2% by mass), a 10% by mass aqueous solution of potassium hydroxide, and pure water were used, and the mixture was adjusted to pH=11.1; thereafter, the liquid temperature inside the container was controlled to 110 to 130° C. by heating. After the temperature inside the container reached 110 to 130° C., while the temperature inside the container was being maintained at 110 to 130° C., the aqueous solution of the activated silicate was continuously supplied for 6.0 hours as a supply solution, until the pH of the reaction solution reached 9.6.

The resulting silica sol was concentrated to give a SiO$_2$ concentration of 40% by mass at room temperature, using a commercially available ultrafiltration apparatus equipped with a tubular polysulfone ultrafiltration membrane with a pore diameter of about 5 nm. During concentration, the solution was stable, and concentration was extremely smoothly performed.

Synthesis Example 4

A SUS pressure-resistant container having an internal volume of 3 L, equipped with a stirrer, a heating device, and the like, was used as a reactor. The aqueous solution of the activated silicate (SiO$_2$ content: 3.2% by mass), a 10% by mass aqueous solution of potassium hydroxide, and pure water were used, and the mixture was adjusted to pH=12.0; thereafter, the liquid temperature inside the container was controlled to 110 to 130° C. by heating. After the temperature inside the container reached 110 to 130° C., while the temperature inside the container was being maintained at 110 to 130° C., the aqueous solution of the activated silicate obtained in the steps (a) to (c) described above was continuously supplied as a supply solution, until the pH of the reaction solution reached 11.4. After the supply of the aqueous solution of the activated silicate, the reaction was performed for 1 hour, while the temperature inside the container was being maintained at 110° C., and the aqueous solution of the activated silicate was further continuously supplied as a supply solution, until the pH of the reaction solution reached 11.1.

Heating was subsequently continued for 2 hours, while the resulting reaction mixture was being maintained at 110 to 130° C.

The resulting silica sol was concentrated to give a SiO$_2$ concentration of 40% by mass at room temperature, using a commercially available ultrafiltration apparatus equipped with a tubular polysulfone ultrafiltration membrane with a pore diameter of about 5 nm. During concentration, the solution was stable, and concentration was extremely smoothly performed.

Comparative Synthesis Example 1

A SUS pressure-resistant container having an internal volume of 3 L, equipped with a stirrer, a heating device, and the like, was used as a reactor. The aqueous solution of the activated silicate (SiO$_2$ content: 3.2% by mass), a 10% by mass aqueous solution of sodium hydroxide, and pure water were used, and the mixture was adjusted to pH=7.6; thereafter, the liquid temperature inside the container was controlled to 150 to 230° C. by heating.

The resulting silica sol was heated at 150 to 200° C. for 2 to 5 hours.

The resulting silica sol was diluted with pure water to give a SiO$_2$ concentration of 30% by mass at room temperature.

Comparative Synthesis Example 2

Tetramethoxysilane was subjected to hydrolysis and condensation using an alkali catalyst (ammonia) at a temperature from room temperature (20° C.) to 60° C. to obtain a silica sol.

Table 1 shows the average particle diameter (DLS particle diameter in the unit nm) of the silica particles in each polishing composition based on a dynamic light scattering method, the average primary particle diameter (BET diameter in the unit nm) of the silica particles calculated as spherical shapes, which was converted from the specific surface area based on a nitrogen gas adsorption method; the shape coefficient SF1 value of the silica particles; and the Rsp value of the silica particles based on pulse NMR.

In the table shown below, the silica sol obtained in Synthesis Example 1 was used for Synthesis Example 1; the silica sol obtained in Synthesis Example 2 was used for Synthesis Example 2; the silica sol obtained in Synthesis Example 3 was used for Synthesis Example 3; the silica sol obtained in Synthesis Example 4 was used for Synthesis Example 4; the silica sol obtained in Comparative Synthesis Example 1 was used for Comparative Synthesis Example 1; and the silica sol obtained in Comparative Synthesis Example 2 was used for Comparative Synthesis Example 2.

TABLE 1

|  | DLS Diameter (nm) | BET Diameter (nm) | SF1 | Rsp |
|---|---|---|---|---|
| Synthesis Example 1 | 56 | 20 | 1.60 | 0.61 |
| Synthesis Example 2 | 143 | 51 | 1.38 | 0.44 |
| Synthesis Example 3 | 30 | 20 | 1.24 | 0.37 |
| Synthesis Example 4 | 68 | 43 | 1.27 | 0.43 |
| Comparative Synthesis Example 1 | 100 | 69 | 1.15 | 0.18 |
| Comparative Synthesis Example 2 | 19 | 17 | 1.36 | 1.46 |

(Preparation of Polishing Compositions)

Each of the aqueous silica sols obtained in Synthesis Examples 1 and 2, and Comparative Synthesis Examples 1 to 4 was adjusted to a SiO$_2$ concentration of 5% by mass with pure water, and adjusted to pH 10.0 with a 10% by mass aqueous solution of potassium hydroxide, and then filtered through a cartridge filter with a pore diameter of 0.5 μm to obtain a polishing composition.

The polishing conditions and the cleaning method were as shown below:

[Polishing Conditions]
  Polishing machine: ChaMP332 (for 12 inches) manufactured by Tokyo Seimitsu Co., Ltd.
  Processing pressure: 1.7 psi
  Platen rotation speed: 90 rpm
  Head rotation speed: 90 rpm
  Polishing pad: Nitta&Haas IC1400XY+Perforate
  Dresser: 3M A2865 (#80 diamond)
  Amount of supply of the polishing diluent: 300 mL/min
  Polishing time: 60 sec
  Substrate: wafer with a TEOS film

[Cleaning Conditions]
  Cleaning was performed with a chemical brush. Initially, cleaning with an acid chemical was performed, rinsing with pure water was performed next, and then drying was performed.

Polishing tests were performed in Example 1 using the silica sol obtained in Synthesis Example 1; Example 2 using the silica sol obtained in Synthesis Example 2; Example 3 using the silica sol obtained in Synthesis Example 3; Example 4 using the silica sol obtained in Synthesis Example 4; Comparative Example 1 using the silica sol obtained in Comparative Synthesis Example 1; and Comparative Example 2 using the silica sol obtained in Comparative Synthesis Example 2.

[Measurement of Polishing Speed]

The polishing speed (nm/minute) was measured using the Nanometrics optical thickness gauge NanoSpec 78300.

[Measurement of Defects]

In the measurement of the number of defects, defects with a size of 180 nm or more were measured using Hitachi LS6700.

TABLE 2

|  | Polishing Speed (nm/min) | Number of Defects (180 nm or more) |
| --- | --- | --- |
| Example 1 | 6.90 | 3850 |
| Example 2 | 25.22 | 227 |
| Example 3 | 2.46 | 2339 |
| Example 4 | 4.15 | 2329 |
| Comparative Example 1 | 1.44 | 10480 |
| Comparative Example 2 | 0.81 | 1822 |

In each of the examples of the present invention, the silica sol used in the polishing composition has an Rsp value based on pulse NMR that falls in a specific range of values, and the silica particles contained in the silica sol have a shape coefficient SF1 value that falls in a specific range of values; therefore, when the silica sol is used as a polishing composition for CMP polishing of a device wafer, a high polishing speed can be achieved, and the formation of defects can be reduced. The polishing composition of the present invention can be used not only as a polishing agent for CMP of a device wafer, but also as a polishing agent for a silicon wafer, because of its high polishing speed.

INDUSTRIAL APPLICABILITY

The silica sol used in the polishing composition has an Rsp value based on pulse NMR that falls in a specific range of values, and the silica particles contained in the silica sol have a shape coefficient SF1 value that falls in a specific range of values; therefore, when the silica sol is used as a polishing composition for CMP polishing of a device wafer, a high polishing speed can be achieved, and the formation of defects can be reduced.

The invention claimed is:

1. A method of manufacturing a polishing composition containing a colloidal silica dispersion comprising silica particles,
the method comprising preparing the colloidal silica dispersion so as to provide colloidal silica particles having a shape coefficient SF1 of 1.20 to 1.80 and an Rsp of 0.15 to 0.7,
measuring the Rsp using pulse NMR,
subjecting the colloidal silica dispersion to a thermal history at a temperature of 110° C. or higher and lower than 150° C., in particle growth of activated silicate under alkaline conditions in the presence of potassium ions,
obtaining a blank aqueous solution by removing the silica particles from the colloidal silica dispersion to measure Rb, which is an inverse of a relaxation time of said blank solution, wherein
Rsp is calculated based on equation (1):

$$Rsp = (Rav - Rb)/(Rb) \quad (1)$$

wherein Rsp is an index that indicates water affinity; Rav is an inverse of a relaxation time of the colloidal silica dispersion; and
the shape coefficient SF1 is calculated based on equation (2):

$$SF1 = (\text{area of a circle whose diameter is a maximum diameter of the particle})/(\text{projected area}) \quad (2),$$

wherein the method of preparing the colloidal silica dispersion comprises:
a step (I) of obtaining activated silicate; a step (II) of heating and regulating the size of the activated silicate; and an optional step (III) of adjusting the concentration of the resulting silica sol, wherein
step (I) is divided into a step (a) of obtaining activated silicate; an optional step (a1) of increasing the purity of the activated silicate; and an optional step (a2) of collecting the activated silicate with an increased purity, in which step (a) is a step of contacting a hydrogen-type strongly acidic cation exchange resin having a pH of 3 to 7 with an aqueous solution of an alkali metal silicate in which an aqueous alkali metal silicate containing 300 to 10,000 ppm of a metal oxide other than silica, based on the silica content, is dissolved at a concentration of 1 to 6% by weight, as the $SiO_2$ content derived from the silicate, to thereby produce an aqueous solution of activated silicate having a $SiO_2$ concentration of 1 to 6% by mass, and collecting the resulting solution,
step (II) includes the following steps (b) and (c):
step (b): adding an aqueous solution of potassium hydroxide to the aqueous solution of the activated silicate collected in the step (a) to produce a stabilized aqueous solution of the activated silicate having a $SiO_2$ concentration of 1 to 6% by mass, and having a pH of 7 to 9; and
step (c): supplying, with sufficient stirring, an aqueous solution of an alkali metal silicate obtained by adding an aqueous solution of potassium hydroxide to the aqueous solution of the activated silicate collected in the step (b) or an aqueous solution of an alkali metal silicate having a pH of 10 to 12.5 and a $SiO_2$ concentration of 0.1 to 8% by weight obtained by concentrating or diluting the aqueous solution obtained above, and an aqueous solution of activated silicate obtained as in the step (b), while maintaining the temperature of the resulting mixture at 110° C. to lower than 150° C., in a period of 1 to 30 hours, until the pH of the mixture reaches 9 to 12, and
step (III) is a step of concentrating the silica sol to a concentration of 10 to 50% by mass, wherein impurities may be removed from the silica sol before or after being concentrated.

2. The method according to claim 1, additionally comprising measuring an average particle diameter of the colloidal silica dispersion by a dynamic light scattering method, and measuring an average primary particle diameter of the silica particles of the colloidal silica dispersion by a nitrogen gas adsorption method, wherein the average particle diameter is 40 to 200 nm as measured by the dynamic light scattering method, and the average primary particle diameter is 10 to 80 nm as measured by the nitrogen gas adsorption method.

3. The method according to claim 2, wherein the colloidal silica dispersion has an average particle diameter of 30 to 150 nm.

4. The method according to claim 2, wherein the silica particles in the dispersion have an average primary particle diameter of 20 to 70 nm.

5. The method according to claim 1, wherein the polishing composition further comprises at least one additive selected from the group consisting of an acid component, an alkali component, a water-soluble compound, a chelating agent, an oxidizing agent, and a metal corrosion inhibitor.

6. The method according to claim 5, wherein the alkali component is present and is potassium hydroxide or potassium hydrogen carbonate, or a mixture of potassium hydroxide or potassium hydrogen carbonate with sodium hydroxide, ammonia, primary ammonium hydroxide, secondary ammonium hydroxide, tertiary ammonium hydroxide, quaternary ammonium hydroxide, primary ammonium carbonate, secondary ammonium carbonate, tertiary ammonium carbonate, quaternary ammonium carbonate, primary ammonium hydrogen carbonate, secondary ammonium hydrogen carbonate, tertiary ammonium hydrogen carbonate, quaternary ammonium hydrogen carbonate, lithium carbonate, sodium carbonate, potassium carbonate, lithium hydrogen carbonate, or sodium hydrogen carbonate.

7. The method according to claim 5, wherein the chelating agent is present and is an aminocarboxylic acid-based chelating agent or a phosphonic acid-based chelating agent.

8. The method according to claim 1, wherein the polishing composition has a pH of 1 to 12.

9. The method according to claim 1, wherein the Rsp is 0.35 to 0.7.

10. The method according to claim 1, wherein the Rsp is 0.35 to 0.65.

11. The method according to claim 1, wherein the SF1 is 1.23 to 1.80.

12. The method according to claim 1, wherein the SF1 is 1.24 to 1.60.

13. A method comprising polishing a silicon wafer or a device wafer with the polishing composition manufactured by the method according to claim 1.

\* \* \* \* \*